United States Patent [19]

Burtscher et al.

[11] 3,777,229

[45] Dec. 4, 1973

[54] THYRISTOR WITH AUXILIARY EMITTER WHICH TRIGGERS FIRST

[75] Inventors: Joachim Burtscher; Karl Peter Frohmader; Alfred Porst; Peter Voss, all of Munich, Germany

[73] Assignee: Siemens Aktiengesellschaft, Berlin and Munich, Germany

[22] Filed: Aug. 1, 1972

[21] Appl. No.: 277,072

[30] Foreign Application Priority Data

Aug. 6, 1971 Germany .................. P 21 39 559.5

[52] U.S. Cl.317/235 R, 317/235 AA, 317/235 AB, 317/235 AE

[51] Int. Cl. ........................ H01l 11/00, H01l 15/00

[58] Field of Search ..................... 317/235, 41, 41.1, 317/44

[56] References Cited

UNITED STATES PATENTS

| | | | |
|---|---|---|---|
| 3,476,989 | 11/1969 | Miles | 317/235 AE |
| 3,566,211 | 2/1971 | Svedberg | 317/235 AE |
| 3,577,046 | 5/1971 | Moyson | 317/235 AB |
| 3,579,060 | 5/1971 | Davis | 317/235 AB |
| 3,586,927 | 6/1971 | Roach | 317/235 AB |

*Primary Examiner*—John W. Huckert
*Assistant Examiner*—Andrew J. James
*Attorney*—Benjamin H. Sherman et al.

[57] ABSTRACT

A thyristor having an auxiliary emitter located between the main emitter and the trigger or gate electrode, the auxiliary emitter being broader in its cross-sectional radial width than about 1 mm so that destructive breakdown of the main thyristor is prevented.

6 Claims, 8 Drawing Figures

THYRISTOR WITH AUXILIARY EMITTER WHICH TRIGGERS FIRST

BACKGROUND OF THE INVENTION

1. Field of the Invention

The invention relates to semiconductor thyristors and more particularly to semiconductor thyristors including an auxiliary emitter.

2. Prior Art

A thyristor is a four-layer semiconductor device in which the alternate layers are of opposite conductivity type. The region or layer of n-type conductivity at one end is frequently referred to as the emitter or cathode. The p-type adjacent layer is usually referred to as the base. The layer farthest from the emitter is soemtimes referred to as the anode. A source of potential is arranged to be connected across the device, the anode being positive with respect to the emitter. A trigger electrode is connected to the base, which when energized with a suitable positive signal with respect to the emitter, turns the device on. The device may also be turned on when a voltage exceeding the forward breakover voltage is applied between the anode and the emitter.

One common thyristor type is a four-layer block or chip of semiconductor material with the emitter diffused into the upper portion of the base as a ring-shaped zone (the emitter layer). This leaves the central upper surface portion of the block within the emitter ring available for forming thereon a trigger electrode. An emitter electrode is, of course, provided on the upper surface of the emitter ring. The undersurface of the anode conventionally is provided with a conductive film, which serves as the anode electrode.

It is to be noted, however, that with this prior art structure fast and safe triggering or gating can only be done without problems when the gating current is high. Only then will the gating process start linearly and/or laminar-like.

It is desirable, however, for a thyristor to have a low gating current requirement, due to the cost of a control circuit. If a low gating current is fed into the control path of a thyristor of prior art types, a small, usually spherical zone is activated initially. This dot-shaped zone must carry the entire load current and thus causes a high specific stress. In turn, this causes overheating and destruction of the member in the spherical or dot-shaped zone. It was for this reason that an auxiliary emitter was suggested which has the effect of forming an auxiliary thyristor with the two base layers and the second emitter (anode). With the auxiliary thyristor positioned between the gate or trigger electrode and the main thyristor, the auxiliary thyristor will be gated first. The load current of the auxiliary thyristor will flow via the base towards the main thyristor and gate it. The auxiliary emitter is dimensioned in such a way that the load current of the auxiliary thyristor causes a linear or a laminar-like gating of the main thyristor initially. When the main thyristor is gated, the load current will only flow through the latter and the auxiliary thyristor will become extinguished.

The gating of the auxiliary thyristor before gating the main thyristor is assured with the above-described thyristor only when the gating current for the thyristor flows via the gating electrode. This, however, is not always the case. As is well known, a thyristor can also be gated by applying a voltage across the thyristor which exceeds the forward breakover voltage. This type of gating is obtained when the forward breakover voltage is exceeded due to an avalanche breakthrough of the blocking pn-junction. In other words, when an applied voltage exceeds the zero gating voltage of the thyristor (breakover voltage), such as when the control voltage is 0, the thyristor switches from a blocking condition to a conducting condition. It is not assured, however, that with breakover ignition the auxiliary thyristor will ignite first. Thus, if the main thyristor ignited first, it will be ignited in a small spherical portion and thus the thyristor will be destroyed if the current density is relatively high.

SUMMARY OF THE INVENTION

The present invention provides a novel arrangement of a thyrsitor embodying an auxiliary emitter in which ignition always takes place in the auxiliary thyristor ahead of the main thyristor even when the forward breakover voltage of the thyristor is exceeded.

It is a novel feature of the present invention to have the auxiliary emitter broader than 1 mm and preferably between 2 and 10 mm wide and with the electrode of the auxiliary emitter electrically connected with the base at one or several places.

It is a further feature of the present invention to have a predetermined relative relationship between the widths of the auxiliary and main emitters of such a character that the auxiliary thyristor will gate first.

It is a further feature of the present invention to connect the electrode of the main emitter to the base remote from the auxiliary emitter.

It is a still further feature of the present invention to provide a main emitter having windows therethrough through which portions of the base extend into contact with the main emitter electrode.

DETAILED DESCRIPTION OF PREFERRED EMBODIMENTS

Figure 1A:
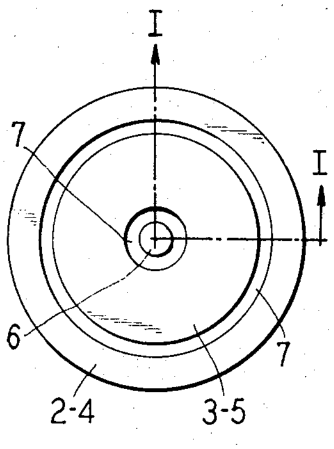
FIG. 1A is a plan view of a thyristor embodying the principles of the invention.

In the drawings similar reference numerals denote similar elements. FIG. 1A shows a thyristor in the form of a circular chip having upper regions 2–4, 3–5, 6 and 7 respectively, details of which will be explained in conjunction with FIG. 1.

Figure 1:
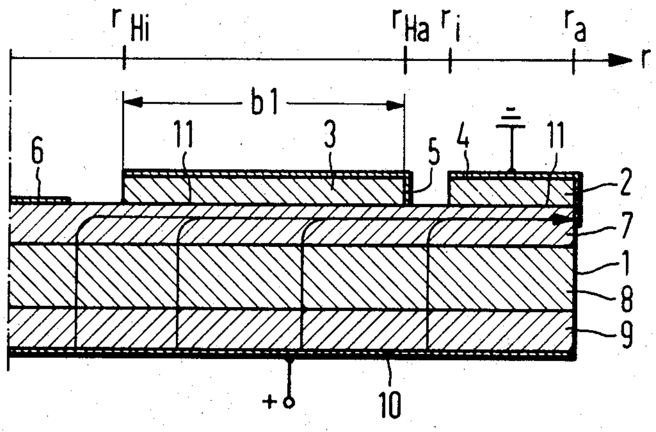
FIG. 1 is a fragmentary sectional view taken along line I—I of FIG. 1A.

As shown at FIG. 1, a thyristor comprises a semiconductor member 1 having four layers 2, 7, 8 and 9 of respective opposite impurity concentration. By way of example, the semiconductor member 1 may be formed of silicon with an n-type main emitter 2 and an auxiliary n-type emitter 3 as a first layer, a p-type base 7 as a second layer, an n-type layer 8 below the p-type base layer 7 and a bottom p-type layer 9. The emitter 2 is provided with an electrode 4, which lies over the upper surface of the emitter 2 and extends down over an edge of emitter 2, which is remote from the auxiliary emitter 3. The portion of the electrode 4 which extends down over the edge of emitter 2 extends over a portion of the outer edge of the base layer 7 and forms an electrical contact therewith. The auxiliary emitter is provided with an electrode 5 which extends over the upper surface of auxiliary emitter 3 and down over the edge of auxiliary emitter 3 into contact with the base layer 7. As clearly shown in FIGS. 1A and 1, the auxiliary emitter 3 is spaced from the main emitter 2. By way of example, the thyristor may be of chip or block form and FIG. 1 illustrates a vertical sectional view over half of the width, the center of the chip being at the left-hand edge.

A gate or trigger electrode 6 is formed as an electrical contact for the central portion of base 7. The dash-dot line in FIG. 1 represents the center axis of the chip shown in plan view at FIG. 1A. An electrofe 10 is formed of molybdenum, for example, on the bottom surface of the lower layer 9. The electrode 10 is arranged to be connected to a source of positive potential while the main electrode 4 is arranged to be connected to ground, for example. Since the significant dimensions for describing the invention relate to the ring-shaped emitter 2 and the ring-shaped emitter 3, there is indicated in FIG. 1 the radial location of certain edge portions of the main emitter 2 and the auxiliary emitter 3. Specifically, the inner edge of the auxiliary emitter 3 is identified as $r_{Hi}$. The radial outer edge of the auxiliary emitter 3 is indicated as being located at $r_{Ha}$. The inner edge of the main emitter 2 is located by the designation $r_i$ and the outer edge of the main emitter 2 is located by the designation $r_a$. As is well known in thyristor technology, there are pn-junctions formed between the layer containing main emitter 2 and auxiliary emitter 3 and the base layer 7. These pn-junctions are designated with the numeral 11. There is, of course, another pn-junction between the layer 7 and the layer 8 and there is also a pn-junction between the layer 8 and the layer 9.

It will further be noted in FIG. 1 that the width of the auxiliary emitter 3 is shown by the notiation *b*l, which preferably is greater than 1 mm. When reference is made to the width of the auxiliary emitter 3 or to the width of the main emitter 2, it refers to the radial dimension of the ring-shaped n-type layer. In certain of the preferred embodiments, the width of the auxiliary emitter is greater than the width of the main emitter.

In order that the auxiliary thyristor formed by the auxiliary emitter 3 and the three successive layers located therebelow ignites first when a voltage is applied to the main terminals of the thyristor which exceeds the forward breakover voltage, the auxiliary emitter 3 is dimensioned to have a width *b*1 of at least 1 mm and preferably between 2 and 10 mm. In exemplary embodiments, the width of the main emitter 2 is, for example, 4 mm, 5mm or 9 mm, depending on the type of thyristor. It is further desirable in order to obtain such ignition sequence to have a border impurity concentration in the auxiliary emitter 3 of between $10^{18}$ and $10^{20}$ $cm^{-3}$ and a border impurity concentration in the base 7 ranging from $10^{16}$ to $10^{18}$ $cm^{-3}$.

When a voltage is applied between the electrodes 10 and 4 (the electrode 10 being positive with respect to the electrode 4), current will uniformly flow from one terminal to the other through the pn-junction between the layers 8 and 7. Thereafter, the current will take a path in accordance with the doping distribution in the semiconductor member, which is just below the pn-junction 11, until it passes therethrough and flows to the electrode 4. The doping of the base layer 7 is highest just below the pn-junction 11 and, for this reason, the resistance is lowest at this region. The amount of doping is the same along the pn-junction 11, i.e., the doping concentration is essentially identical under auxiliary emitter 3 and the main emitter 2.

Figure 2:
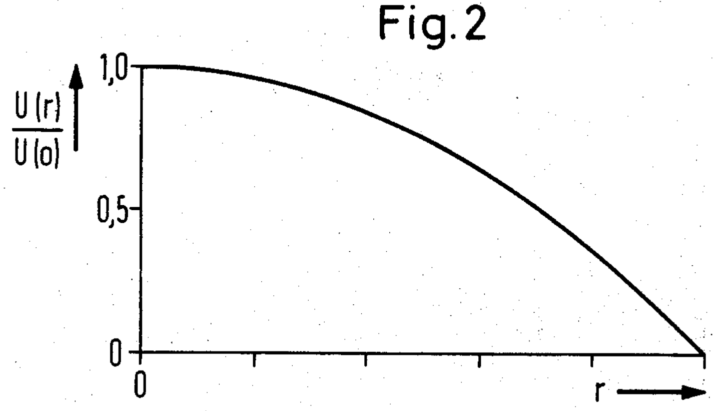
FIG. 2 is a graph showing the potential gradient in the structure of FIG. 1 above the marginal range of the p-base zone as a function of the radius.
Figure 3:
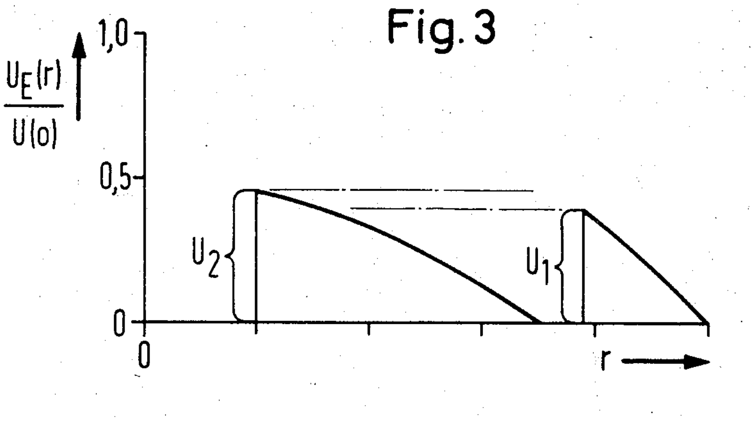
FIG. 3 is a graph of the voltage at the pn-junction between the main emitter and the adjacent base zone and between the auxiliary emitter and the adjacent base zone.

The potential distribution U($r$) below the pn-junction 11, as shown in FIG. 2, depends on the radius. The reference point for the voltage is the potential U($o$) of the base 7 at the zero radius. The voltage gradients at the pn-junction 11 are inserted in the diagram of FIG. 3. The voltage gradient below main emitter 2 is shown in FIG. 3 as descending from a voltage amplitude of $U_1$ at the left-hand edge of emitter 2. The voltage gradient at the pn-junction 11 below the auxiliary emitter 3 is shown in FIG. 3 as descending from a voltage amplitude of $U_2$ at the left-hand edge of emitter 2. The voltage at the left edge of main emitter 2 at radius $r_i$ results from the difference of the potentials existing at radius $r_a$ and $r_i$. This voltage is shown as $U_1$. The voltage drop at the pn-junction at the left edge of the auxiliary emitter 3 at radius $r_{Hi}$ results from the potential difference between the outer edge (radius $r_{Ha}$) and the inner edge (radius $r_{Hi}$). This voltage is denoted by $U_2$ in FIG. 3.

By way of example, the voltage $U_2$ may be 0.45 V and the voltage $U_1$ may, for example, be 0.35 V. Under such circumstances, the auxiliary thyristor formed by the auxiliary emitter 3 and the layers therebelow will gate ahead of the main thyristor formed by the main emitter 2 and the layers therebelow since there is a stronger injection of electrons from the auxiliary emitter 3 into the base 7 due to the higher base emitter voltage across the pn-junction lying below the auxiliary emitter 3.

After the auxiliary thyristor has been gated, a load current will flow via the electrode 5 into the base layer 7 and then into the main emitter 2. The load current of the auxiliary thryistor forms a strong control current for the main thyristor so that the latter will be triggered linearly. An overload of the main thyristor is thus avoided. The auxiliary thyristor cannot be overloaded since the current transfer onto the auxiliary thyristor is affected very rapidly. The auxiliary thyristor extinguishes after the main thyristor has been triggered.

Figure 4:
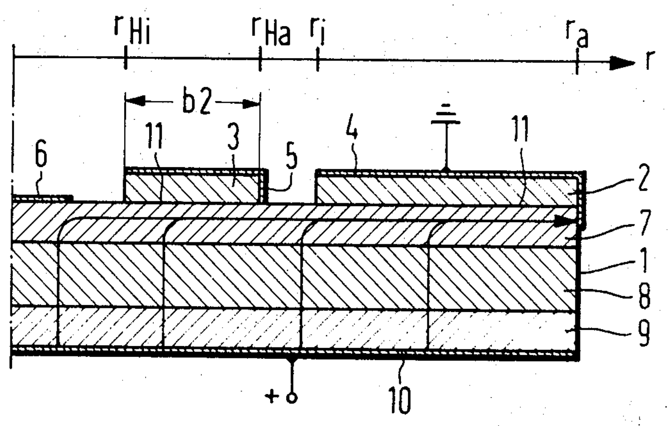
FIG. 4 is a fragmentary sectional view of a thyristor of a type of structure which does not embody the present invention.
Figures 5, 6:
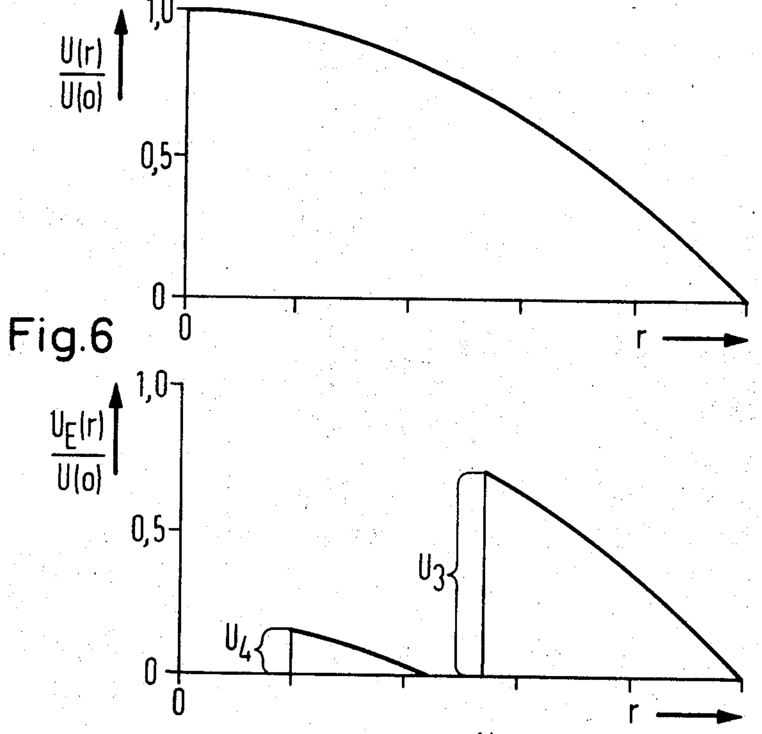
FIGS. 5 and 6 show the potential gradients per structure of the type illustrated in FIG. 4.

In order to emphasize the dimensional importance of the present invention, FIGS. 4, 5 and 6 illustrate a form of thyristor which will not provide the benefits of the present invention and which in no way forms part of the present invention.

In the structure shown in FIG. 4, similar parts to those shown in FIG. 1 are given the same reference numerals. As shown in FIG. 4, the auxiliary emitter 3 has a width smaller than the width of the main emitter 2. The reference character *b*2 identifies the width of the auxiliary emitter 3. FIG. 5 illustrates that the potential distribution U(*r*) below the pn-junction 11 depends on the radius. FIG. 6 illustrates the voltage curve at the pn-junction below the main emitter at the right-hand side and below the auxiliary emitter at the left-hand side. It will be noted that the potential drop across the pn-junction 11 has a lower level $U_4$ at the left-hand edge of the auxiliary emitter 3 than does the potential drop across the pn-junction 11 below the left-hand edge of main emitter 2 indicated as $U_3$. By way of example, as shown in FIG. 6, the voltage $U_3$ may be 0.6 V and the voltage $U_4$ may be 0.15 V. It will thus be apparent that in the structure of FIG. 4 the main thyristor will trigger first, due to the fact that the current produced during the charge carrier multiplication, which is effective as a gating current, is relatively small during a forward breakover voltage. Hence, the main thyristor will only gate a small spherical zone which will tend to destroy the thyristor.

Figure 7:
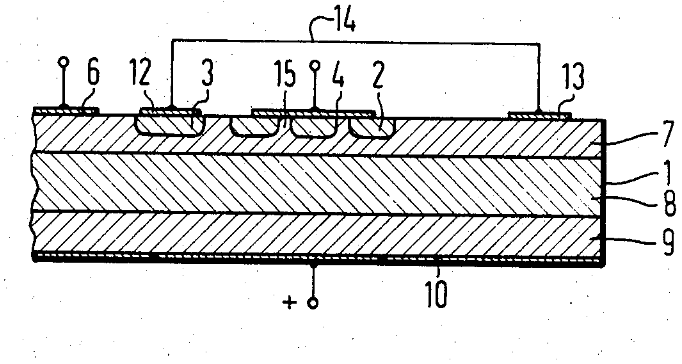
FIG. 7 is a fragmentary sectional view of a modified form of thyristor embodying the novel teachings of the present invention.

In FIG. 7 of the drawings, there is illustrated a modification of the present invention. Portions of the drawing having parts similar to those in FIG. 1 are given the same reference numerals. FIG. 7 differs from FIG. 1 in that the auxiliary emitter 3 is not directly electrically connected with the base layer 7 by an electrode. Rather, the auxiliary emitter 3 is provided with an electrode 12 which is externally connected to an electrode 13 at a point radially outwardly from the main emitter 2, the external connection being shown by conductor 14.

The structure of FIG. 7 further differs from the structure of FIG. 1 in that emitter 2 is not connected at an edge thereof remote from the auxiliary emitter 3 with the base layer 7 by its electrode 4. Instead, base layer 7 is provided with a plurality of windows that form the emitter 2 as shown, and portions of the base layer 7 extend between such windows, as at 15 into contact with the main emitter electrode 4. Here, as in FIG. 1, the auxiliary and main thyristors are dimensioned in such a way that the auxiliary thyristor will always gate first during forward breakover.

A further modification of the structure in FIG. 1 may be had by combining the last mentioned feature of FIG. 7 with that of FIG. 1, that is, windows through the main emitter layer 2 may be provided through which portions of the base 7 extend into contact with the electrode 4. When relatively large diameters are employed for the semiconductor members, it is desirable that many windows be provided throughout the emitter layer to improve the *dU/dt* characteristic. The hereinbefore described dimension of the auxiliary emitter can be used for all diameters.

The auxiliary thyristor's ability to gate increases with the width of the auxiliary emitter. When thyristors are employed in which the current causing the triggering process is distributed homogeneously over the thyristor area, a minimum width of auxiliary emitter will suffice. With a non-homogeneous distribution of current employed for the triggering process, the width of the auxiliary emitter must be enlarged.

The ignition of the auxiliary thyristor before the main thyristor is triggered is assured by the structure of the present invention even when a voltage is in the form of a pulse having a steep slope is used for triggering. The distribution of the emitter-base voltage is qualitatively the same as when triggering by forward breakover voltage It is formed by the displacement current of capacitance of the blocking pn-junction.

The invention thus broadly provides a thyristor semiconductor having a plurality of zones or layers with adjacent zones being of opposite conductivity type. A gate or trigger electrode is attached to a given zone along with a main emitter remotely spaced from the gate electrode. An auxiliary emitter is attached to the given zone between the gate electrode and the main emitter. The voltage difference across the auxiliary emitter is greater than that across the main emitter when a forward voltage is applied to the main electrodes.

As is apparent from the foregoing specification, the present invention is susceptible of being embodied with various alterations and modifications which may differ from those that have been described in the preceding specification and description. For example, the thyristors may be formed in different configurations, such for instance, as a planar-type thyristor, a mesa-type thyristor, etc. For this reason, it is to be fully understood that all of the foregoing is intended to be merely illustrative and is not to be construed or interpreted as being restrictive or otherwise limiting of the present invention, excepting as it is set forth and defined in the hereto-appended claims.

We claim as our invention:

1. A thyristor comprising a semiconductor member with at least four zones of alternate conductivity type; a first zone being a main emitter and an auxiliary emitter laterally spaced from each other, and a second zone being a base; said main emitter having an electrode thereon and said base having a gating electrode thereon; said auxiliary emitter being positioned between said main emitter and said gating electrode and electrically connected with said base; said auxiliary emitter having a width greater than 1 mm and said electrode of said main emitter being electrically connected with said base at least one place remote from said auxiliary emitter.

2. A thyristor according to claim 1 in which said auxiliary emitter has a width in the range of 2 and 10 mm.

3. A thyristor according to claim 1 in which said auxiliary and main emitter are dimensioned with respect to each other so that when the forward breakover voltage is exceeded in the forward direction, the auxiliary thyristor will gate first.

4. A thyristor comprising a semiconductor member with at least four zones of alternate conductivity type; a first zone being a main emitter and an auxiliary emitter laterally spaced from each other, and a second zone being a base; said main emitter having an electrode thereon and said base having a gating electrode thereon; said auxiliary emitter being positioned between said main emitter and said gating electrode and electrically connected with said base; said main emitter and said auxiliary emitter having a width dimension with respect to each other so that when the breakover voltage of the thyristor is exceeded in the forward direction, the auxiliary emitter will gate first; and said electrode of said main emitter being electrically connected with said base at least one place remote from said auxiliary emitter.

5. A thyristor comprising a semiconductor member having at least three zones with adjacent zones of opposite conductivity type, a gate electrode attached to one of said zones, a main emitter attached to said one of said zones remotely from said gate electrode, and an auxiliary emitter attached to said one of said zones between said gate electrode and said main emitter and said auxiliary emitter having a greater dimension than said main emitter in the direction between said gate electrode and said main emitter.

6. A thyristor comprising a semiconductor member having a plurality of zones with adjacent zones being of opposite conductivity type, a gate electrode attached to one of said zones, a main emitter attached to said one of said zones remotely from said gate electrode and an auxiliary emitter attached to said one of said zones between said gate electrode and said main emitter, the voltage difference across said auxiliary emitter being greater than that across said main emitter when a forward voltage is applied to said main electrodes.

* * * * *